United States Patent
Ayres et al.

(10) Patent No.: US 10,075,694 B2
(45) Date of Patent: Sep. 11, 2018

(54) SYSTEM FOR IDENTIFYING A 3D CHIP

(71) Applicant: STMicroelectronics (Crolles 2) SAS, Crolles (FR)

(72) Inventors: Alexandre Ayres, Grenoble (FR); Bertrand Borot, Le Cheylas (FR)

(73) Assignee: STMICROELECTRONICS (CROLLES 2) SAS, Crolles (FR)

( * ) Notice: Subject to any disclaimer, the term of this patent is extended or adjusted under 35 U.S.C. 154(b) by 0 days.

(21) Appl. No.: 15/681,135

(22) Filed: Aug. 18, 2017

(65) Prior Publication Data

US 2018/0192027 A1 Jul. 5, 2018

(30) Foreign Application Priority Data

Jan. 2, 2017 (FR) ...................................... 17 50011

(51) Int. Cl.
| | |
|---|---|
| *H01L 23/522* | (2006.01) |
| *H04N 13/00* | (2018.01) |
| *G11C 5/04* | (2006.01) |
| *G11C 29/44* | (2006.01) |
| *B42D 25/42* | (2014.01) |
| *B42D 25/305* | (2014.01) |

(52) U.S. Cl.
CPC ....... *H04N 13/0066* (2013.01); *B42D 25/305* (2014.10); *B42D 25/42* (2014.10); *G11C 5/04* (2013.01); *G11C 29/44* (2013.01)

(58) Field of Classification Search
CPC ... H01L 23/52; H01L 23/522; H01L 23/5226; H01L 23/525; H01L 23/528; G11C 5/02; G11C 5/025; G11C 5/04; G11C 5/06
See application file for complete search history.

(56) References Cited

U.S. PATENT DOCUMENTS

| | | | | |
|---|---|---|---|---|
| 7,969,193 | B1 * | 6/2011 | Wu | ...................... H01L 25/0657 257/758 |
| 8,564,305 | B2 * | 10/2013 | Chen | ........................ G11C 5/02 324/537 |
| 2011/0311018 | A1 * | 12/2011 | Chen | .................... H03K 21/023 377/47 |
| 2012/0124408 | A1 * | 5/2012 | Byeon | ...................... G11C 5/04 713/501 |
| 2012/0326752 | A1 | 12/2012 | Hook et al. | |
| 2013/0257503 | A1 | 10/2013 | Chen et al. | |
| 2016/0218046 | A1 * | 7/2016 | Or-Bach | ............. H01L 27/0688 |
| 2017/0179104 | A1 * | 6/2017 | Ayres | .................. H01L 27/0207 |

OTHER PUBLICATIONS

French Search Report and Written Opinion, dated Sep. 25, 2017, for French Application No. 1750011, 7 pages.

* cited by examiner

*Primary Examiner* — Jason M Crawford

(74) *Attorney, Agent, or Firm* — Seed IP Law Group LLP

(57) ABSTRACT

A semiconductor chip includes a plurality of superposed semiconductor levels. The semiconductor levels include a plurality of elementary circuits coupled to a common input node. Sensing circuits are coupled to elementary elements of different levels. The outputs of the sensing circuits are used to generate a number, which serves as an identification number of the semiconductor chip.

25 Claims, 4 Drawing Sheets

SYSTEM FOR IDENTIFYING A 3D CHIP

BACKGROUND

Technical Field

The present disclosure relates to electronic chips and more particularly to a system for allocating an identification number to a three-dimensional chip (3D chip).

Description of the Related Art

It is known to insert identification numbers on electronic chips, for example by laser engraving or by printing. These identification numbers make it possible for example to determine the provenance of the chip. A drawback of inserting an identification number on each chip is that this makes it necessary to add specific steps to the chip fabrication steps, which can be relatively expensive.

Moreover, it is known to form three-dimensional chips or 3D chips, that is to say chips whose components are formed in several superposed semiconductor levels. Components are formed in and on each semiconductor level and interconnection networks are associated with each semiconductor level. The semiconductor levels are connected to one another by vias termed Through Silicon Vias (TSV).

BRIEF SUMMARY

In an embodiment a chip comprises: at least two superposed semiconductor levels, in each of which are formed elementary circuits of one and the same type all connected to one and the same input node; and a plurality of components, each being suitable for providing a value dependent on a difference between the output signals of first and second elementary circuits, situated respectively in first and second semiconductor levels, the output signals of the plurality of components being combined to form a number.

According to one embodiment, the elementary circuits are logic circuits.

According to one embodiment, the elementary circuits are inverters.

According to one embodiment, each component is suitable for comparing the response time of the elementary circuits.

According to one embodiment, the elementary circuits are sources of current.

According to one embodiment, each component is suitable for comparing the amplitude of the output signal of the elementary circuits.

According to one embodiment, a chip comprises a number of components greater than a thousand.

According to one embodiment, a chip comprises a temperature management circuit.

In an embodiment, a semiconductor chip comprises: a plurality of superposed semiconductor levels including a plurality of elementary circuits of a first type coupled to a common input node; and a plurality of sensing circuits, each of the plurality of sensing circuits being coupled to: an output of a respective one of the plurality of elementary circuits of a semiconductor level of the plurality of semiconductor levels; and an output of a respective one of the plurality of elementary circuits of another semiconductor level of the plurality of semiconductor levels, wherein each of the plurality of sensing circuits, in operation, generates an output signal and a number associated with the semiconductor chip is based on the output signals of the plurality of sensing circuits. In an embodiment, the elementary circuits of the first type comprise logic circuits. In an embodiment, the elementary circuits of the first type comprise inverters. In an embodiment, the sensing circuits comprise flip-flops. In an embodiment, the elementary circuits of the first type comprise current sources. In an embodiment, the sensing circuits comprise sense amplifiers. In an embodiment, the semiconductor chip comprises one or more processing cores. In an embodiment, the semiconductor chip comprises a temperature management circuit. In an embodiment, the semiconductor chip comprises number generating circuitry coupled to the outputs of the plurality of sensing circuits. In an embodiment, the semiconductor chip comprises a comparator coupled to an output of the number generating circuitry.

In an embodiment, a system comprises: a plurality of superposed semiconductor levels including a plurality of elementary circuits of a first type coupled to a common input node; a plurality of sensing circuits respectively coupled to: an output of one of the plurality of elementary circuits of a semiconductor level of the plurality of semiconductor levels; and an output of one of the plurality of elementary circuits of another semiconductor level of the plurality of semiconductor levels, wherein each of the plurality of sensing circuits, in operation, generates an output signal; and number generating circuitry coupled to the outputs of the plurality of sensing circuits, wherein the number generating circuitry, in operation, generates a number based on the output signals generated by the plurality of sensing circuits. In an embodiment, the elementary circuits of the first type comprise logic circuits. In an embodiment, the elementary circuits of the first type comprise inverters. In an embodiment, the sensing circuits comprise flip-flops. In an embodiment, the elementary circuits of the first type comprise current sources. In an embodiment, the sensing circuits comprise sense amplifiers. In an embodiment, the system comprises a temperature management circuit. In an embodiment, the system comprises a comparator coupled to an output of the number generating circuitry. In an embodiment, the plurality of sensing circuits are included in one or more of the plurality of superposed semiconductor levels. In an embodiment, the plurality of superposed semiconductor levels include a plurality of elementary circuits of a second type coupled to a second common input node and the system comprises: a second plurality of sensing circuits respectively coupled to: an output of one of the plurality of elementary circuits of the second type in a semiconductor level of the plurality of semiconductor levels; and an output of one of the plurality of elementary circuits of the second type in another semiconductor level of the plurality of semiconductor levels, wherein each of the second plurality of sensing circuits, in operation, generates an output signal, the number generating circuitry is coupled to the outputs of the second plurality of sensing circuits, and the number generating circuitry, in operation, generates the number based on the output signals generated by the plurality of sensing circuits and the output signals generated by the second plurality of sensing circuits. In an embodiment, the plurality of superposed semiconductor levels include a second plurality of elementary circuits of the first type coupled to a second common input node and the system comprises: a second plurality of sensing circuits respectively coupled to: an output of one of the second plurality of elementary circuits of the first type in a semiconductor level of the plurality of semiconductor levels; and an output of one of the second plurality of elementary circuits of the first type in another semiconductor level of the plurality of semiconductor levels, wherein each of the second plurality of sensing circuits, in operation, generates an output signal, the number generating circuitry is coupled to the outputs of the second plurality of sensing circuits, and the number generating circuitry, in operation, generates the number based on the output signals generated by the plurality of sensing circuits and the output signals generated by the second plurality of sensing circuits. In an embodiment, the system comprises a semiconductor chip including at least the plurality of superposed semiconductor layers.

In an embodiment, a method comprises: generating, using a plurality of elementary circuits of a first type and in response to a common input signal, a plurality of elemental circuit output signals; generating, using a plurality of sensing circuits respectively coupled to one of the plurality of elementary circuits of the first type in one of a plurality of superposed semiconductor layers and to one of the plurality of elementary circuits of the first type in another of the plurality of superposed semiconductor layers, a plurality of sensing circuit output signals; and generating a number based on the plurality of sensing circuit output signals. In an embodiment, the method comprises controlling a temperature of the plurality of elementary circuits of the first type. In an embodiment, the method comprises: comparing the number to an expected number; and controlling operation of a semiconductor device based on the comparison.

BRIEF DESCRIPTION OF THE SEVERAL VIEWS OF THE DRAWINGS

These characteristics and potential advantages, as well as others, will be set forth in detail in the following nonlimiting description of particular embodiments, given in conjunction with the attached figures among which.

DETAILED DESCRIPTION

Like elements have been designated by like references in the various figures, unless the context indicates otherwise, and, moreover, the diverse figures are not drawn to scale. For the sake of clarity, only the elements useful for understanding the embodiments described have been represented and are detailed.

In the description which follows, when reference is made to position qualifiers, such as the terms "upper", "lower", etc., reference is made to the orientation of the figures in an example position of use, for example, a normal position of use.

Figure 1:
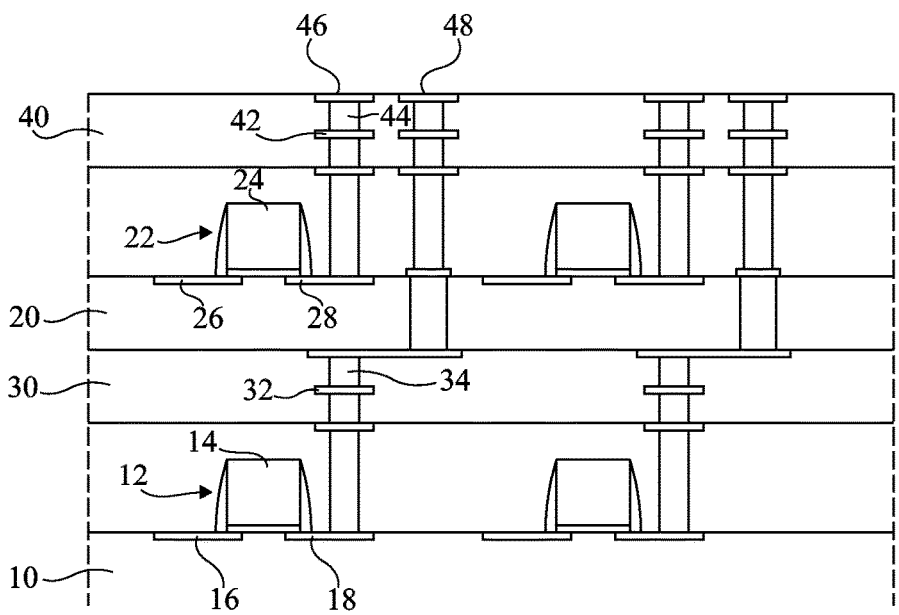
FIG. 1 is a partial sectional view of an exemplary 3D chip.

FIG. 1 is a partial sectional view of an embodiment of a so-called three-dimensional or 3D chip. In this example, the chip comprises two superposed semiconductor levels 10 and 20. Semiconductor components, for example MOS transistors, are formed in and on each of these levels. Transistors 12, each of which comprises an insulated gate 14 on either side of which are formed source and drain regions 16 and 18, have been represented in the lower level 10. Likewise, transistors 22, each of which comprises an insulated gate 24 and source and drain regions 26 and 28, are formed in the upper semiconductor level 20. Each semiconductor level is surmounted by an interconnection structure 30, for the lower level, and 40, for the upper level. In a conventional manner, in the interconnection structure of each level is formed a succession of metallization layers, respectively 32 and 42, able to be connected to one another by vias 34 and 44. Conducting pathways extending from a drain region 28 of the upper level to an upper metallization 46 and a conducting pathway extending from a drain region 18 of the lower level to an upper metallization 48, have been represented in FIG. 1. This has been represented solely to show that it is possible without difficulty, by conventional methods, to obtain access to the drain regions of the transistors from upper metallizations 46 and 48. Of course, conducting pathways typically will also be provided to connect the gates and the source regions of transistors to chosen nodes.

Figure 2:
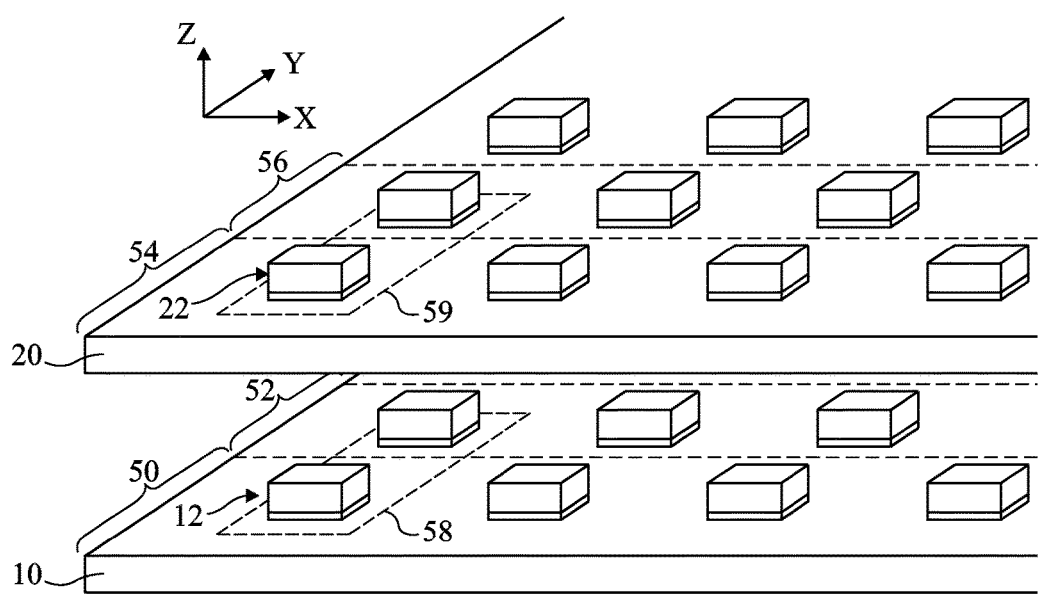
FIG. 2 is a partial and schematic perspective view of an exemplary 3D chip.

FIG. 2 is a schematic perspective view of a chip, illustrating an arrangement of transistors in a 3D structure with two levels. In this figure, the interconnection structures are not represented and the transistors are represented solely by their gates.

An orthogonal frame is represented by X, Y, Z. The direction X is the direction of the chip edge depicted in the first plane of FIG. 2. The direction Y is the direction of an orthogonal edge of the chip. The direction Z is the direction orthogonal to the directions X and Y and therefore to the chip (here the vertical direction).

Parallel rows of transistors extending in the direction X have been represented. Alternate rows may comprise complementary transistors, namely P-channel transistors and N-channel transistors. The references 50 and 52 designate alternate rows of the lower level 10 and references 54 and 56 designate alternate rows of the upper level 20. Thus, two transistors which are adjacent in the direction Y are complementary transistors which may for example be connected as an inverter. Thus, rows of inverters 58 are found in the lower level 10, and rows of inverters 59 are found in the upper level 20. In an embodiment, each inverter 59 is situated plumb with an inverter 58.

Figure 3A:
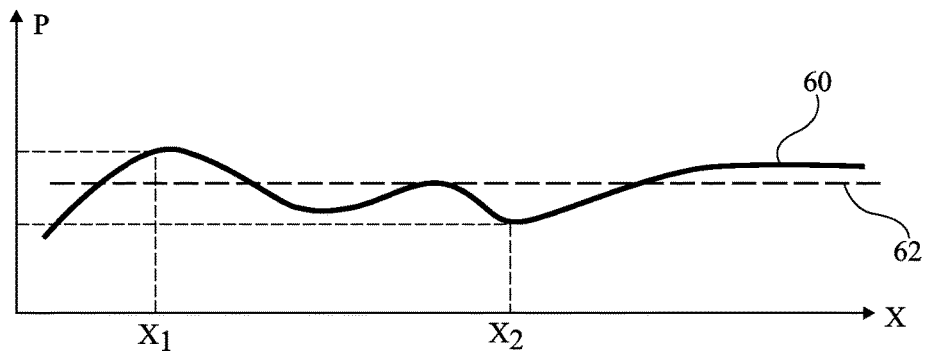
FIGS. 3A and 3B represent the value of a parameter of a transistor as a function of the position of the transistor in a semiconductor level.

FIG. 3A represents a curve 60 illustrating the variations of a parameter P of a transistor or of an inverter of the lower level, as a function of its position X on the chip. Curve 60 corresponds for example to the values of the parameter P for the transistors or the inverters of one and the same row. The average value of the parameter P is represented by a straight line 62. The parameter P may for example correspond to the current flowing between two terminals of a transistor which is subjected to a given gate/source or gate/drain voltage, to the threshold voltage of a transistor, to the response time of an inverter, to the output current of an inverter, to the current provided by a current source.

Figure 3B:
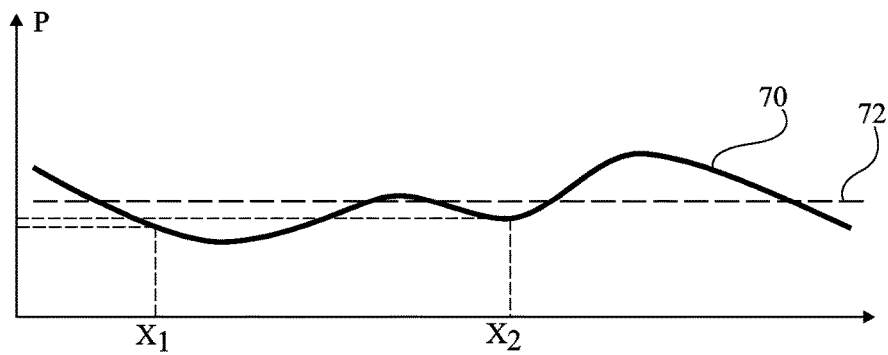

FIG. 3B represents a curve 70 similar to the curve 60 in the case of transistors or inverters of the upper level. Curve 70 corresponds for example to the values of the parameter P for the transistors or the inverters of one and the same row situated above the row of the lower level corresponding to curve 60. The average value of the parameter P is represented by a straight line 72.

The variations of the parameter P are caused by structural differences between the transistors from one point to another of a chip. These differences are for example differences of gate dimensions, of gate insulator thickness etc. It is noted that the variations of the parameter P in the lower level are independent of the variations of the parameter P in the upper level. These variations are not correlated. Stated otherwise, the value of the parameter P for a transistor of an upper level row 54 at a given position $X=X_1$ is not correlated with that of a transistor of a lower level row 50 at this same given position. It follows from this that the difference between the values of the parameter P at two points $X=X_1$ of the upper and lower levels and the difference between the values of the parameter P at two points $X=X_2$ are not correlated.

Figure 4:
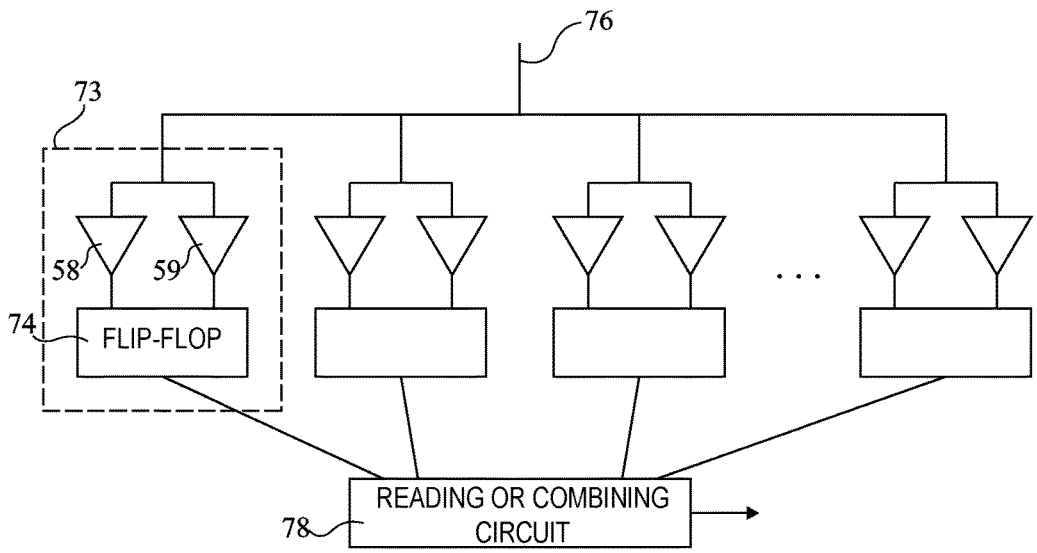
FIG. 4 is a schematic representation of an embodiment of a system for identifying a 3D chip.

FIG. 4 is a schematic representation of an embodiment of a system for identifying a 3D chip. FIG. 4 represents several sets 73, one of which is surrounded by dashes, each comprising an inverter 58 of the lower level, an inverter 59 of the upper level and an RS flip-flop 74. The outputs of the inverters 58 and 59 of each set 73 are connected to the inputs of the associated flip-flop 74. The flip-flops 74 can be formed in one or the other of the semiconductor levels 10 and 20.

The inverters 58 and 59 all receive one and the same input signal 76. For this same input signal, the response times of the two inverters 58 and 59 of a set 73 are not identical, this being so in a random manner. The flip-flop 74 provides as output a binary value for example equal to the value 0 if the response time of the inverter 58 of the lower level is lower than the response time of the inverter 59 of the upper level, and equal to the value 1 if the response time of the inverter 59 is lower than the response time of the inverter 58.

The outputs (0 or 1) of the flip-flops 74 are connected to the inputs of a reading or combining circuit 78. The circuit 78 is for example a register with parallel inputs and with serial output. This register combines the binary values originating from the flip-flops 74 so as to provide an identification number. The outputs of the flip-flops 74 can be combined in a different manner from that described above, for example, they can be read as a string of hexadecimal values.

If the number of flip-flops 74 is high, for example greater than a thousand, this identification number is unique and individual to the chip.

Certain parameters P are liable to vary when large temperature fluctuations arise. It may then be desirable to provide a temperature regulating circuit. The temperature regulating circuit facilitates providing, during reading of the identification number of the chip, that the temperature of the identification system is at the same value as during the previous readings. Possible errors due to temperature fluctuations can thus be avoided.

An advantage of using inverters is that they may be implemented by the formation of few transistors. It is nonetheless possible to replace the inverters 58 and 59 by other elementary logic circuits.

It is also possible to replace the flip-flops 74 by other components suitable for providing a value (e.g., a binary value) dependent on the difference between the parameters P of two elementary circuits.

The identification system described hitherto is of digital type. Provision could also be made for a system of an analog type.

Figure 5:
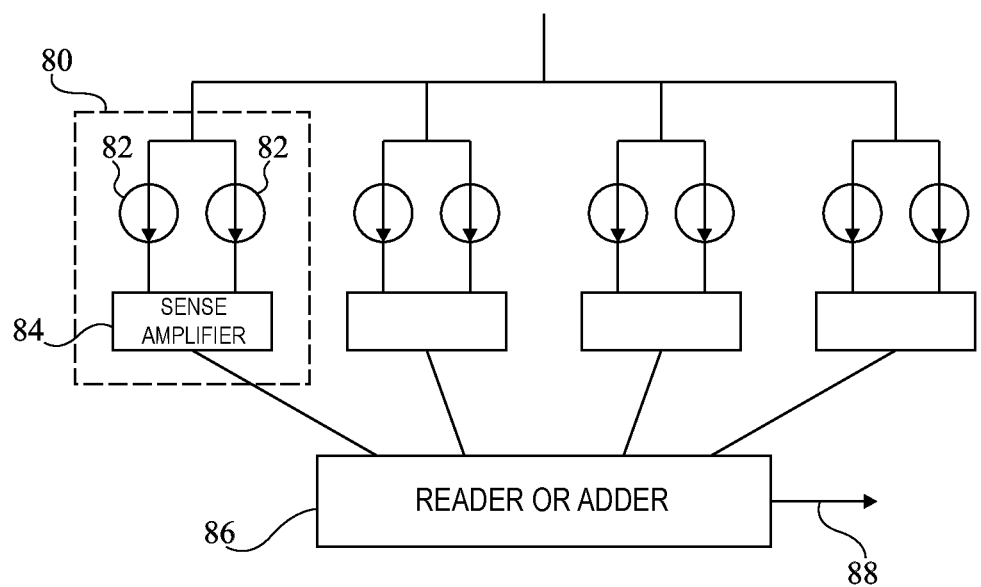
FIG. 5 is a schematic representation of another embodiment of a system for identifying a 3D chip.

FIG. 5 represents an exemplary embodiment of an identification system of analog type. The system comprises sets 80, one of which is surrounded by dashes, formed of two current sources 82 situated in different levels of the 3D chip and of a detection amplifier (also known as a "Sense Amplifier") 84. The outputs of the current sources 82 of each set 80 are connected to the inputs of the associated detection amplifier 84. The output of each detection amplifier 84 is no longer a binary value, but an analog value obtained by measuring the difference of amplitude of the current provided by the associated current sources 82. The output values of the detection amplifiers 84 are, in this example, added together by a summator or adder 86 to form the identification number 88.

An advantage of an embodiment of the system of analog type based on current sources with respect to the logic system based on voltage comparisons is that the operation of the system based on current sources does not in particular depend on the connection lengths and embodiments of the connections. On the other hand, in the system of logic type, the imbalance between the response times of the inverters may be due not to the inverters themselves but to the connection lengths towards these inverters and between these inverters and the RS flip-flops, which may impose fabrication constraints (e.g., to maintain a random nature of the differences in response time).

Figure 6:
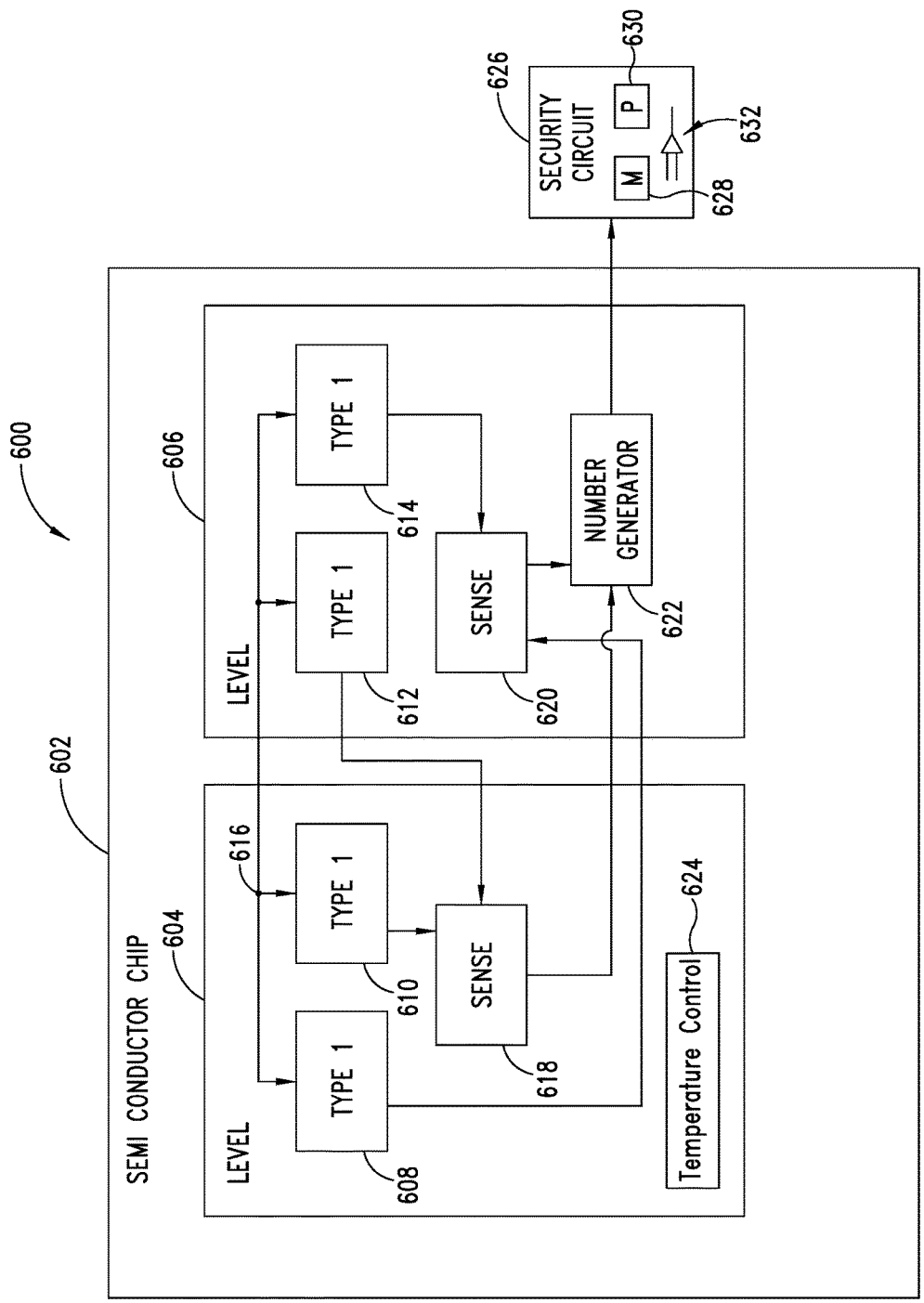
FIG. 6 is a functional block diagram of a system including a 3D chip.

FIG. 6 is a functional block diagram of an embodiment of a system 600. The system 600 includes a semiconductor chip 602 including a plurality of superposed semiconductor levels 604, 606. For ease of illustration, only two levels are shown. The superposed semiconductor levels include a plurality of elementary circuits of a first type 608, 610, 612, 614 coupled to a common input node 616. A plurality of sensing circuits 618, 620 are coupled to respective outputs of the plurality of elementary circuits of the first type LC1 608, 610, 612, 614 of different semiconductor levels. Each of the plurality of sensing circuits 618, 620, in operation, generates an output signal based on the outputs of the elementary circuits of the first type to which the sensing circuit is coupled (e.g., one from a first semiconductor level 604 and one from a second semiconductor level 606, as illustrated). Number generating circuitry 622 is coupled to the outputs of the plurality of sensing circuits and generates a number based on the output signals generated by the plurality of sensing circuits. As discussed above, the elementary circuits of the first type may comprise logic circuits, such as inverters, current sources, etc. The sensing circuits may comprise flip-flops, sense amplifiers, etc. The system 600 may comprising a temperature management circuit 624, which as illustrated is embedded in semiconductor level 604 and may comprise, for example, heating elements and control circuitry.

The system comprises security circuitry 626, which as illustrated is separate from the semiconductor chip 602 but which may be embedded in one or more of the levels 604, 606 of the semiconductor chip 602 in some embodiments. The security circuitry 626 may comprise, for example, one or more memories M 628, one or more processing cores P 630 and one or more comparators 632. The security circuitry 626 may, in operation, compare a number generated by the number generating circuitry 622 to an expected number, and control operation and access to or by the system 600 based on the comparison. Particular embodiments have been described. Diverse variants and modifications will be apparent to the person skilled in the art. In particular, the chip can be a 3D chip with N levels, N being an integer greater than 2. Each level is formed in a similar manner to the levels 10 and 20, 604, 606 previously described. Elementary circuits, for example, inverters, are formed facing one another in the direction Z. Inverter or other elementary circuit outputs chosen in two different levels or in each of the levels can be combined to provide an identification number.

The transistors making up the inverters or other elements have been described as being MOS transistors. They may be replaced with transistors of other types, for example bipolar transistors.

It will be noted that the identification number described here can be used to permit or deny access to a chip and/or to a system using the chip.

Some embodiments may take the form of or comprise computer program products. For example, according to one embodiment there is provided a computer readable medium comprising a computer program adapted to perform one or more of the methods or functions described above. The medium may be a physical storage medium, such as for example a Read Only Memory (ROM) chip, or a disk such as a Digital Versatile Disk (DVD-ROM), Compact Disk (CD-ROM), a hard disk, a memory, a network, or a portable media article to be read by an appropriate drive or via an appropriate connection, including as encoded in one or more barcodes or other related codes stored on one or more such computer-readable mediums and being readable by an appropriate reader device.

Furthermore, in some embodiments, some or all of the methods and/or functionality may be implemented or provided in other manners, such as at least partially in firmware and/or hardware, including, but not limited to, one or more application-specific integrated circuits (ASICs), digital signal processors, discrete circuitry, logic gates, standard integrated circuits, controllers (e.g., by executing appropriate instructions, and including microcontrollers and/or embedded controllers), field-programmable gate arrays (FPGAs), complex programmable logic devices (CPLDs), etc., as well as devices that employ RFID technology, and various combinations thereof.

The various embodiments described above can be combined to provide further embodiments. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A semiconductor chip, comprising:
   a plurality of superposed semiconductor levels including a plurality of elementary circuits of a first type coupled to a common input node; and
   a plurality of sensing circuits, each of the plurality of sensing circuits being coupled to:
      an output of a respective one of the plurality of elementary circuits of a semiconductor level of the plurality of semiconductor levels; and
      an output of a respective one of the plurality of elementary circuits of another semiconductor level of the plurality of semiconductor levels, wherein each of the plurality of sensing circuits, in operation, generates an output signal and a number associated with the semiconductor chip is based on the output signals of the plurality of sensing circuits.

2. The semiconductor chip according to claim 1 wherein the elementary circuits of the first type comprise logic circuits.

3. The semiconductor chip according to claim 2 wherein the elementary circuits of the first type comprise inverters.

4. The semiconductor chip according to claim 3 wherein the sensing circuits comprise flip-flops.

5. The semiconductor chip according to claim 1 wherein the elementary circuits of the first type comprise current sources.

6. The semiconductor chip according to claim 5 wherein the sensing circuits comprise sense amplifiers.

7. The semiconductor chip according to claim 1, comprising one or more processing cores.

8. The semiconductor chip according to claim 1, comprising a temperature management circuit.

9. The semiconductor chip of claim 1, comprising number generating circuitry coupled to the outputs of the plurality of sensing circuits.

10. The semiconductor chip of claim 9, comprising a comparator coupled to an output of the number generating circuitry.

11. A system, comprising:
    a plurality of superposed semiconductor levels including a plurality of elementary circuits of a first type coupled to a common input node;
    a plurality of sensing circuits respectively coupled to:
       an output of one of the plurality of elementary circuits of a semiconductor level of the plurality of semiconductor levels; and
       an output of one of the plurality of elementary circuits of another semiconductor level of the plurality of semiconductor levels, wherein each of the plurality of sensing circuits, in operation, generates an output signal; and
    number generating circuitry coupled to the outputs of the plurality of sensing circuits, wherein the number generating circuitry, in operation, generates a number based on the output signals generated by the plurality of sensing circuits.

12. The system of claim 11 wherein the elementary circuits of the first type comprise logic circuits.

13. The system of claim 12 wherein the elementary circuits of the first type comprise inverters.

14. The system of claim 13 wherein the sensing circuits comprise flip-flops.

15. The system of claim 11 wherein the elementary circuits of the first type comprise current sources.

16. The system of claim 15 wherein the sensing circuits comprise sense amplifiers.

17. The system of claim 11, comprising a temperature management circuit.

18. The system of claim 11, comprising a comparator coupled to an output of the number generating circuitry.

19. The system of claim 11 wherein the plurality of sensing circuits are included in one or more of the plurality of superposed semiconductor levels.

20. The system of claim 11 wherein the plurality of superposed semiconductor levels include a plurality of elementary circuits of a second type coupled to a second common input node and the system comprises:
    a second plurality of sensing circuits respectively coupled to:
       an output of one of the plurality of elementary circuits of the second type in a semiconductor level of the plurality of semiconductor levels; and
       an output of one of the plurality of elementary circuits of the second type in another semiconductor level of the plurality of semiconductor levels, wherein each of the second plurality of sensing circuits, in operation, generates an output signal, the number generating circuitry is coupled to the outputs of the second plurality of sensing circuits, and the number generating circuitry, in operation, generates the number based on the output signals generated by the plurality of sensing circuits and the output signals generated by the second plurality of sensing circuits.

21. The system of claim 11 wherein the plurality of superposed semiconductor levels include a second plurality of elementary circuits of the first type coupled to a second common input node and the system comprises:
a second plurality of sensing circuits respectively coupled to:
an output of one of the second plurality of elementary circuits of the first type in a semiconductor level of the plurality of semiconductor levels; and
an output of one of the second plurality of elementary circuits of the first type in another semiconductor level of the plurality of semiconductor levels, wherein each of the second plurality of sensing circuits, in operation, generates an output signal, the number generating circuitry is coupled to the outputs of the second plurality of sensing circuits, and the number generating circuitry, in operation, generates the number based on the output signals generated by the plurality of sensing circuits and the output signals generated by the second plurality of sensing circuits.

22. The system of claim 11, comprising a semiconductor chip including at least the plurality of superposed semiconductor layers.

23. A method, comprising:
generating, using a plurality of elementary circuits of a first type and in response to a common input signal, a plurality of elemental circuit output signals;
generating, using a plurality of sensing circuits respectively coupled to one of the plurality of elementary circuits of the first type in one of a plurality of superposed semiconductor layers and to one of the plurality of elementary circuits of the first type in another of the plurality of superposed semiconductor layers, a plurality of sensing circuit output signals; and
generating a number based on the plurality of sensing circuit output signals.

24. The method of claim 23, comprising controlling a temperature of the plurality of elementary circuits of the first type.

25. The method of claim 23, comprising:
comparing the number to an expected number; and
controlling operation of a semiconductor device based on the comparison.

* * * * *